United States Patent [19]
Yamagata et al.

[11] Patent Number: 5,311,134
[45] Date of Patent: May 10, 1994

[54] MAGNETIC RESONANCE IMAGING SYSTEM

[75] Inventors: Hitoshi Yamagata; Masafumi Kondo, both of Otawara; Fumikazu Takahashi, Nasu, all of Japan

[73] Assignee: Kabushiki Kaisha Toshiba, Kawasaki, Japan

[21] Appl. No.: 931,692

[22] Filed: Aug. 18, 1992

[30] Foreign Application-Priority Data

Feb. 21, 1992 [JP] Japan .................... 4-35247

[51] Int. Cl.$^5$ .............................. G01V 3/00
[52] U.S. Cl. .................... 324/318; 324/322; 128/653.5
[58] Field of Search ............ 324/318, 322, 307, 309, 324/314; 128/653.5

[56] References Cited

U.S. PATENT DOCUMENTS

| | | | |
|---|---|---|---|
| 4,926,125 | 8/1988 | Roemer | 324/318 |
| 5,049,821 | 9/1991 | Duensing et al. | 324/322 |
| 5,066,915 | 11/1991 | Omori et al. | 324/318 |
| 5,138,260 | 8/1992 | Molyneaux et al. | 324/309 |
| 5,197,474 | 3/1993 | Englund et al. | 324/318 |

FOREIGN PATENT DOCUMENTS 6420835 7/1987 Japan .

Primary Examiner—Louis Arana
Attorney, Agent, or Firm—Limbach & Limbach

[57] ABSTRACT

An MR imaging system comprises a first gradient coil unit(first G coil unit) for providing magnetic gradients superimposed in a static magnetic field, a first RF coil unit for transmitting an RF pulse to a patient and receiving a MR signal from the patient, a second gradient coil unit(second G coil unit) and a second RF coil unit. The second G coil unit is located between the patient and the first G coil unit. In a first operating mode(for example, spin echo scan mode), the second G and RF coil units are moved out the first G coil unit and the first RF coil unit is moved into the first G coil unit by guiding these units along a rail or the second G and RF coil units are drawn out from the first G coil unit and the first RF coil unit is inserted into the first G coil unit so that these units are located in predetermined position. A connection of a gradient power source to the first and second G coil unit and a connection of a duplexer to the first and second RF coil unit are switched so that the gradient power source is connected to the first G coil unit and the duplexer is connected to the first RF coil assembly. In a second operating mode(for example, echo planar scan mode), these units are located inversely and the connections are switched inversely. In one preferred embodiment, the second G coil unit and the first RF coil unit are integrated into an inner unit and these units are moved together by moving the inner unit.

19 Claims, 10 Drawing Sheets

MAGNETIC RESONANCE IMAGING SYSTEM

BACKGROUND OF THE INVENTION

This invention relates to a magnetic resonance(MR) imaging system and more particularly to an MR imaging system for acquiring image data in a rapid scan.

MR imaging is a remarkable technique for a medical diagnosis because a good contrast image for head or spine tissue can be acquired.

An MR imaging system for acquiring image data in a few seconds can suppress an artifact caused by respiratory motion.

Furthermore, there is known a possibility of acquiring image data in a fraction of a second, with echo planar imaging(EPI).

The MR imaging system using EPI operates as follows. First, a 90° pulse is applied; and following the 90° pulse, 180° pulse a is applied. Then gradients are superimposed on a static magnetic field dephase spins. A gradient of reverse polarity is then applied in a predetermined direction to refocus the spins, and a first echo is acquired. The phase encoding gradient is then immediately incremented and the same procedure is repeated and second echo is acquired. In this way, all data in a k-space can be sampled in one shot.

Furthermore, with this technique, motion such as in a heart, elbow or knee of a human body, can be viewed in essentially real time.

However, in order to acquire data in a fraction of a second with EPI, very large gradient amplitudes are required, and large gradient amplitudes require large gradient coil currents. For example, a 5 mT/m gradient requires about 500 A current in a gradient coil in which a human body can fit.

Further, rapid gradient switching, for example at 100 μ second, is required.

In a conventional MR imaging system with EPI, a very high voltage gradient coil is required which in turn requires a very high capability-power source such a gradient power source requires extra space for installation and extra cost, and uses a great amount of electric energy.

These problems also occur with other imaging techniques, for example, techniques for imaging blood flow or angiography which also require very large gradient amplitudes, rapid switching capabilities and higher sampling rate.

The Japanese Patent Laid-Open Publication No. 64-20835. filed Jul. 16, 1987, and published Jan. 24, 1989, discloses an MR imaging system comprising a gradient coil for superimposing a gradient in three mutually orthogonal axes on a static magnetic field and comprises an inversion gradient coil for applying an alternating gradient, wherein said inversion gradient coil is provided independently from said gradient coil.

U.S. Pat. No. 4,926,125, issued May 15, 1990, discloses a surface gradient assembly for high-speed, high-resolution NMR imaging comprising at least one substantially planar gradient coil.

SUMMARY OF THE INVENTION

An object of this invention is to provide an MR imaging system for acquiring image data in a standard scan, and for acquiring image data in a rapid scan without substantially modifying a gradient power source of a presently-existing typical MR imaging system.

Another object Of this invention is to provide an MR imaging system which can facilitate selection of one of a first operating mode, for example the standard scan, and a second operating mode for example, the rapid scan.

According to this invention, there is provided an MR imaging system for forming an image of sample using nuclear magnetic resonance, comprising:
- a magnet for applying a static magnetic field to the sample;
- a first gradient coil means for providing a magnetic gradient which is superimposed on the static magnetic field, the first gradient coil means being provided between the sample and the magnet;
- a first RF coil means for transmitting an RF pulse to the sample and receiving a nuclear resonace from the sample, the first RF coil means being provided between the sample and the first gradient coil means;
- a second gradient coil means for providing a magnetic gradient which is superimposed on the static magnetic field, the second gradient coil means being located between the sample and the first gradient coil means;
- a second RF coil means for transmitting an RF pulse to the sample and receiving a nuclear resonace from the sample, the second RF coil means being provided between the sample and the second gradient coil means; and
- a selection means for alternatively selecting one of a first operating mode, in which at least the first gradient coil means and the first RF coil means are operated and a second operating mode in which at least the second gradient coil means and the second RF coil means are operated.

In one preferred embodiment, the selection means comprises a positioning means for locating the first RF coil means in a predetermined position in the first operating mode and locating the second gradient coil means and the second RF coil means in predetermined positions in the second operating mode.

In another preferred embodiment, the MR imaging system further comprises,
- a gradient power source for operating the first gradient coil means and the second gradient coil means; and
- a duplexer for switching between transmission of an RF pulse and reception of the nuclear magnetic resonace, wherein the selection means comprises a switch means for switching a connection of the gradient power source to the first gradient coil means and the second gradient coil means and for switching a connection of the duplexer to the first RF coil means and the second RF coil means.

In a further preferred embodiment, the positioning means comprises a moving means for moving the first RF coil means and the second gradient coil means.

Thus, the second gradient coil means and the first RF coil means can be located in predetermined positions quickly and easily so that a standard scan with spin echo, etc., and a rapid scan with echo planar, etc., including blood flow imaging or angiography, need not to be performed with different systems, but rather performed with the same MR imaging system which has a gradient power source typical of presently-existing MR imaging systems.

In a still further preferred embodiment, the first RF coil means and the second gradient coil means are integrated into one unit to facilitate the movement of the second gradient coil means and the first RF coil means. Thus, the standard scan and the rapid scan can be switched efficiently.

BRIEF DESCRIPTION OF THE DRAWINGS

For a more complete understanding of this invention reference may be made to the following detailed explanations in conjunction with the accompanying drawing in which.

DESCRIPTION OF THE PREFERRED EMBODIMENTS

Figure 1A:
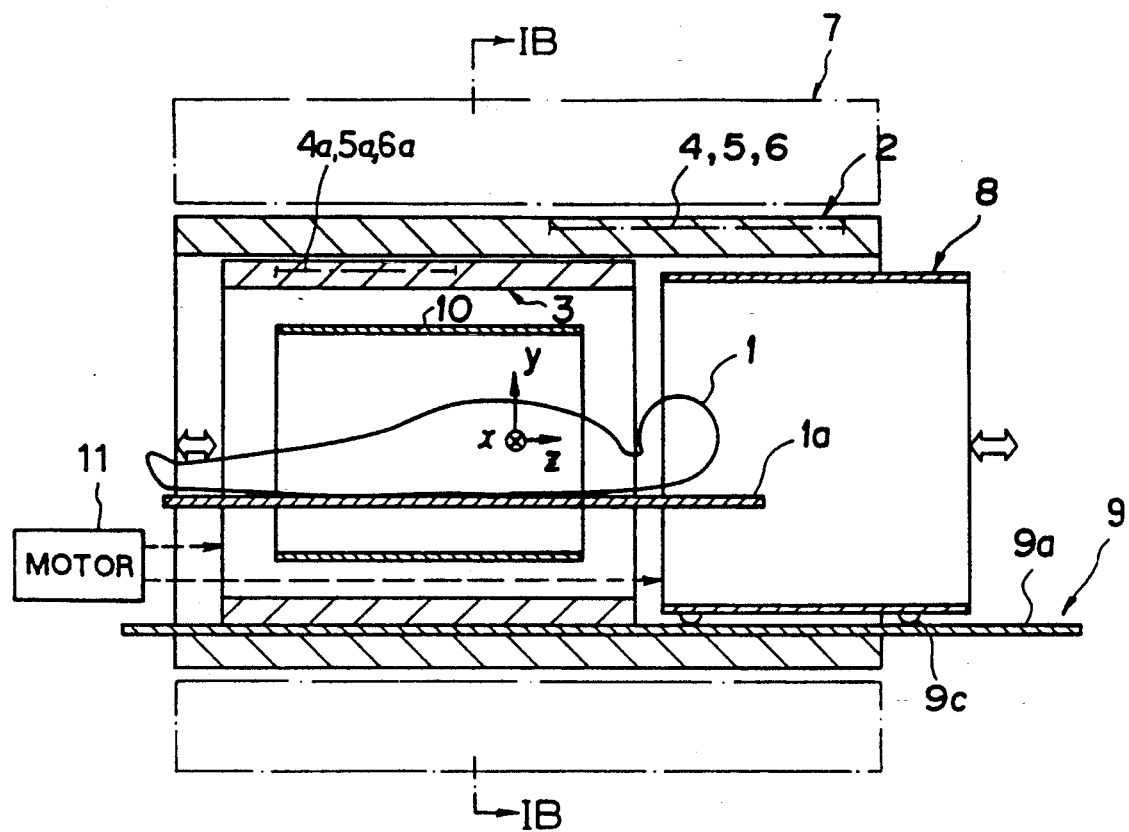
FIG. 1A is a section showing a preferred embodiment of an MR imaging system according to this invention.

Referring now to the accompanying drawing, the MR imaging system shown in FIG. 1A forming images of a sample, for example patient 1, using a nuclear magnetic resonance, comprises a magnet 7 for applying a static magnetic field to a patient 1 lying on a bed 1a, a first gradient coil means 2 for providing magnetic gradients in x, y, and z axes which are superimposed on the static magnetic field, and a first RF coil means 8 for applying an RF pulse to the patient 1 and receiving an MR signal from the patient 1.

The magnet 7, the first gradient coil means 2 and the first RF coil means 8 are hollow cylinders. The first gradient coil means 2 is located within the magnet 7 and the first RF coil means 8 is located within the first gradient coil means 2. The magnet 7 may be typically superconducting magnet, and the first RF coil means 8 can be provided with an RF coil of a saddle type or a solenoid type for whole body imaging.

The MR imaging system further comprises a second gradient coil means 3 for providing magnetic gradients in x, y, and z axes.

The second gradient coil means 3 a is a hollow cylinder and is located within the first gradient coil means 2.

The first gradient coil means 2 is provided with three gradient coils, a Gx coil 4, a Gy coil 5 and a Gz coil 6.

The second gradient coil means 3 is also provided with three gradient coils: a Gx coil 4a, a Gy coil 5a and a Gz coil 6a.

Herein, for facility of understanding, we assume that the frequency-encoding direction, or readout direction, is the x-axis, the phase-encoding direction is the y-axis, and the slice-selecting direction is the z-axis and that thus, the Gx coils 4 and 4a are used for a readout gradient, the Gy coil 5 and 5a are used for a phase-encoding gradient, and the Gz coil 6 and 6a are used for a slice-selecting gradient.

The Gx coil 4a, the Gy coil 5a and the Gz coil 6a are smaller in diameter than the Gx coil 4, the Gy coil 5 and the Gz coil 6 respectively. Therefore the self inductance of the coils 4a, 5a and 6a are much smaller than that of the coils 4,5 and 6 respectively because a self inductance of a coil is propotional to the third power of the coil diameter.

A gradient coil generates an alternating current voltage in propotion to the product of the self inductance of the coil and a rate of current which flows in the coil. Therefore, as described in prior art, because the prior MR imaging systems require a very large gradient amplitudes and rapid switching capabilities, a high performance power source is required for gradient coils. However, the MR imaging system of this invention can acquire data in a rapid scan with a power source which is substantially identical with the prior sources. It can do this because the gradient coils 4a, 5a and 6a have less self inductance and less length of coil wire.

The MR imaging system further comprises a second RF coil means 10 for transmitting the RF pulse and receiving the nuclear resonace. The second RF coil means 10 is a hollow cylinder located within the second gradient coil means 3 and attached to the second gradient coil means 3.

The MR imaging system further comprises a selection means for alternatively selecting one of a first operating mode, for example the standard scan(spin echo etc.), in which the first gradient coil means and said first RF coil means are operated and a second operating mode, for example the rapid scan(echo planar etc.), in which the second gradient coil means 3 and the second RF coil means 10 are operated.

The selection means comprises a positioning means for locating the first RF coil means 8 in a predetermined position in the first operating mode and for locating the second gradient coil means 3 and the second RF coil means 10 in predetermined positions in the second operating mode. The positioning means comprises a moving means for moving the first RF coil means 8 and the second gradient coil means 3 and the moving means comprises a guide means 9 for guiding the first RF coil means 8 and the second gradient coil means 3.

The guide means 9 comprises a rail 9a attached to an inner surface of the first gradient coil means 2, a slot 9b provided in an outer surface of the second gradient coil means 3, into which the rail 9a is fitted, and a wheel 9c provided in an outer surface of the first RF coil means 8, which runs on the rail 9a, to move the second gradient coil means 3 and the first RF coil means 8 independently within the first gradient coil means 2 along a direction of an arrow shown in FIG. 1A.

The moving means preferably comprises an actuator for actuating the second gradient coil means 3 and the first RF coil means 8. The actuator preferably comprises an electric motor 11.

Figure 2:
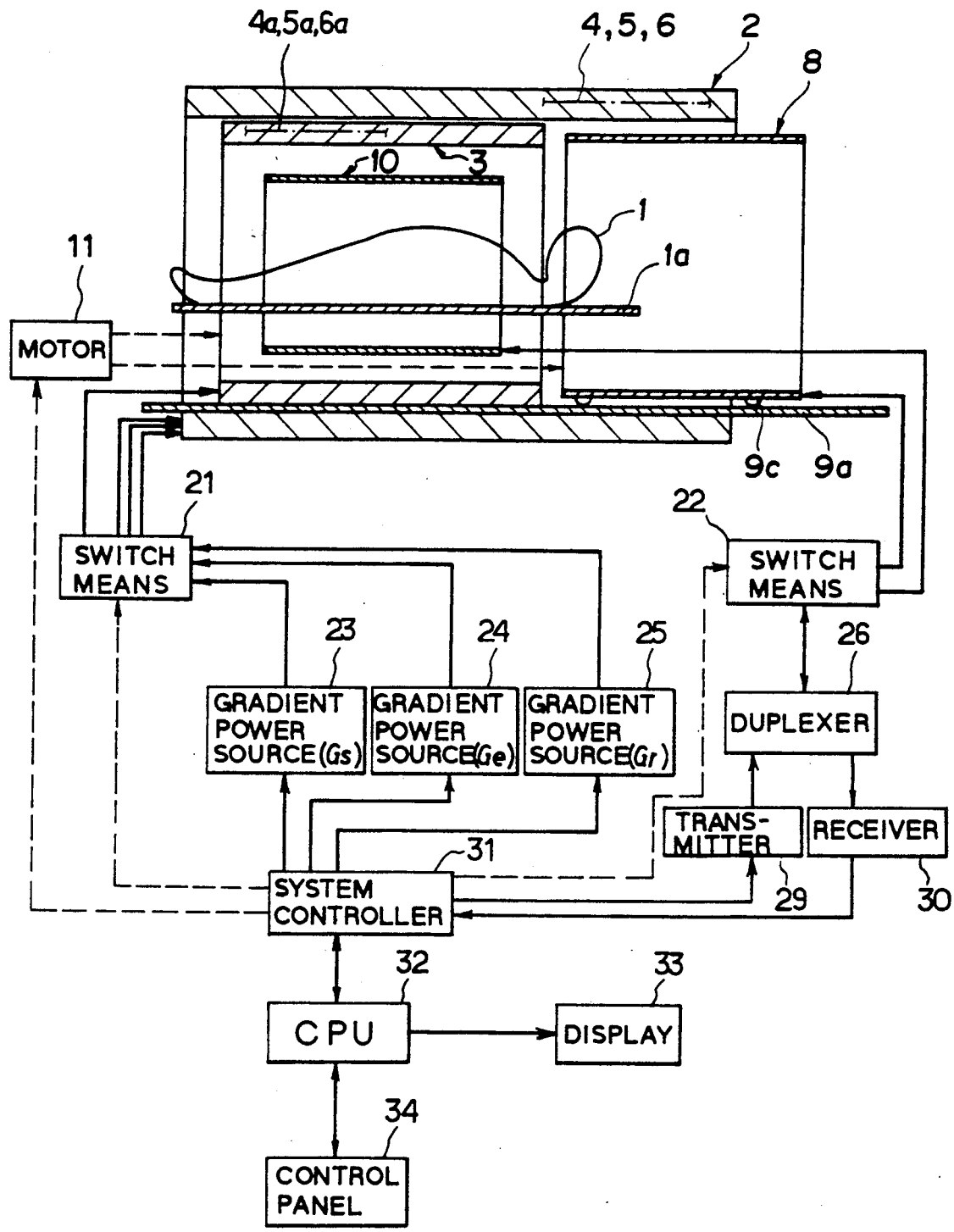
FIG. 2 is a block diagram showing the preferred embodiment.

The MR imaging system, as shown in FIG. 2, comprises three gradient power sources 23, 24 and 25. The gradient power source(Gs) 23 drives a gradient coil which applies a gradient in a slice-selecting direction. The gradient source(Ge) 24 drives a gradient coil which applies a gradient in a phase-encoding direction. The gradient source(Gr) 25 drives a gradient coil which applies a gradient in a readout direction.

Now, in a standard scan with spin echo method, for example, a gradient current is not so large and a rise time of gradient is not so rapid in the slice-selecting direction, the phase-encoding direction and the readout direction. However, in a rapid scan with echo planar method, for example, while in the slice-selecting direction and the phase-encoding direction, the gradient current is not so large and the rise time of gradient is not so rapid similarly, in the readout direction, the gradient requires a larger current and a shorter rise time.

Herein, as above assuming, the coils 4 and 4a apply a gradient in the read out direction, the coils 5 and 5a apply a gradient in the phase-encoding direction and the coils 6 and 6a apply the gradient in a slice-selecting direction. Therefore, in this embodiment, in the standard scan, the gradient power sources 23,24 and 25 should be connected to the gradient coils 6,5 and 4 respectively and in the rapid scan the gradient sources 23,24 and 25 should be connected to the corresponding gradient coils 6,5, and 4a respectively.

The MR imaging system further comprises a transmitter 29 for transmitting an RF pulse to the patient 1 through the first RF coil means 8 or the second RF coil means 10, a receiver 30 for receiving an MR signal from the patient 1 through the first RF coil means 8 or the second RF coil means 10 and a duplexer 26 for switching between transmission and reception.

The selection means comprises a switch means 21 for switching a connection of the gradient power source 23,24,25 between the gradient coils 4,5,6 and the gradient coils 4a, 5a, 6a and a switch means 22 for switching a connection of the duplexer 26 between first RF coil means 8 and the second RF coil mean 10.

Figure 3A:
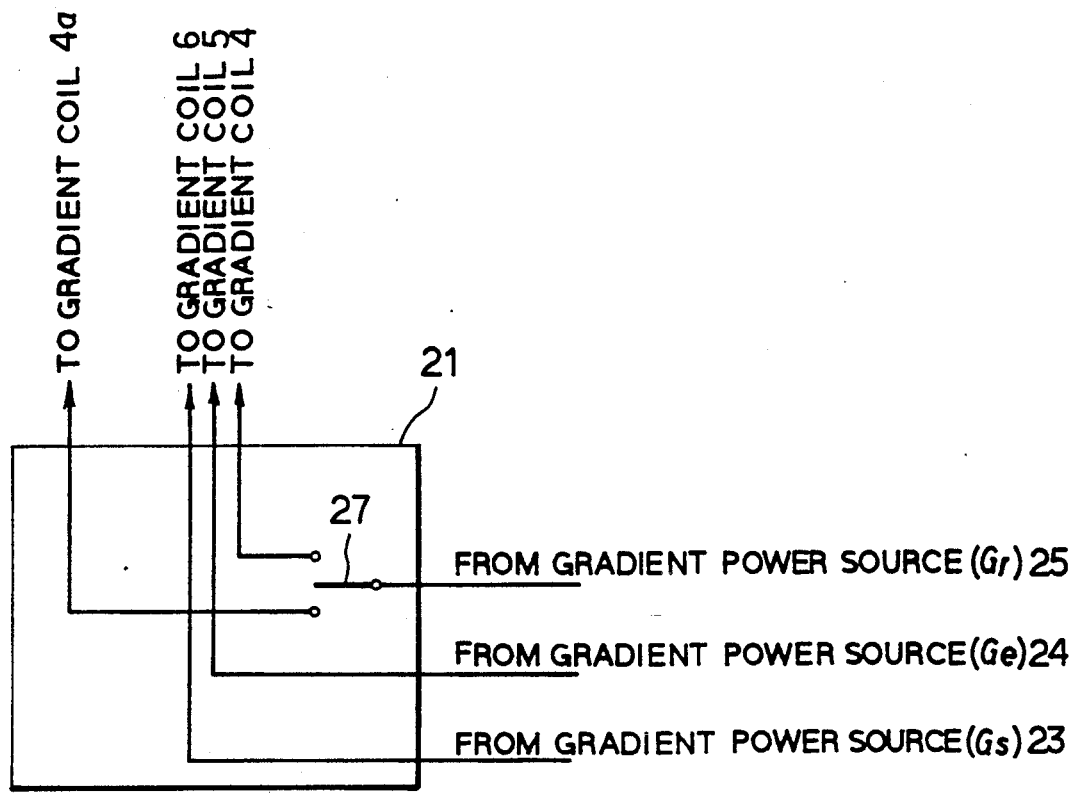
FIGS. 3A and 3B are block diagrams of the switch means shown in FIG. 2.
Figure 3B:
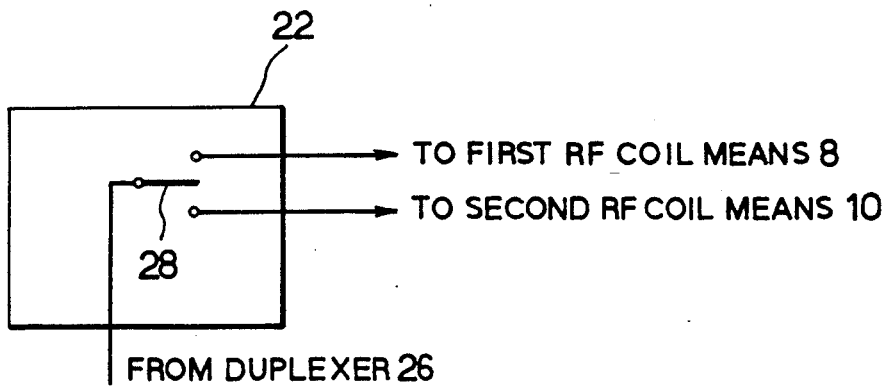

FIG. 3A and 3B are block diagrams of the switch means 21 and 22, respectively.

As shown in FIG. 3A, the switch means 21 comprises a switch 27 which can switch a connection from the gradient power source 25 to a coil in a readout direction, herein, the gradient coil 4 or the gradient coil 4a. The switch means 22 comprises a switch 28 which can switch a connection from the duplexer 26 to the first RF coil means 8 or the second RF coil means 10.

Referring to FIG. 2 again, the MR imaging system further comprises a system controller 31 for controlling a pulse sequence and controlling the switching of the switch means 21 and 22, a central processing unit(CPU) 32 for reconstructing image data using the received MR data, a display 33 for displaying the image data and a control panel 34 for inputting parameters for operation.

The system controller 31 can control the motor 11 to move the second gradient coil means 3 and the first RF coil means 8 to predetermined positions. The illustrated MR imaging system operates as follows. First, the rapid scan, for example, of the heart of the patient 1 is described.

Figure 4A:
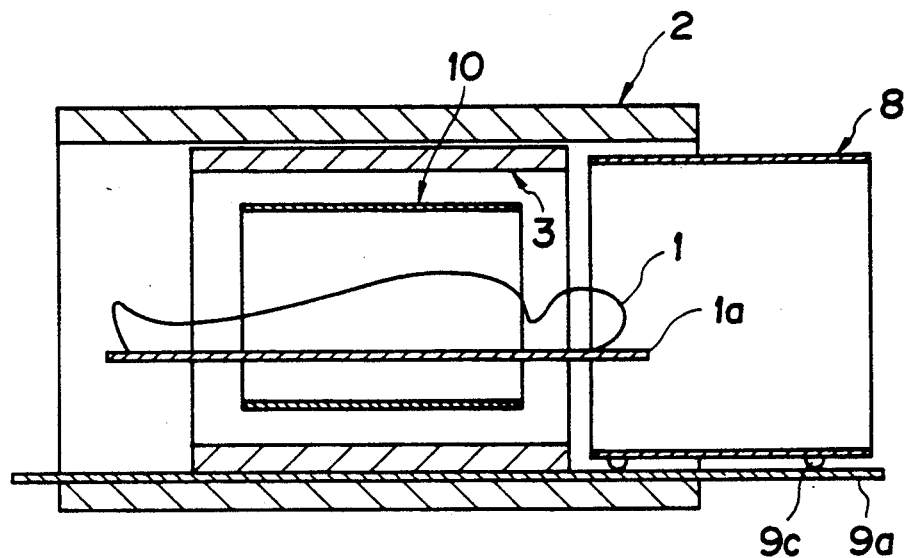
FIG. 4A and 4B are sections showing an operation of the preferred embodiment.

The spin echo imaging, field echo imaging etc. are effective for an imaging of a spine or an abdomen, but not effective for an imaging of a heart because of the cardiac artifact. Therefore, in this case, MR data should be acquired by echo planar imaging. Thus, as shown in FIG. 4A, the first RF coil means 8 is moved out of the first gradient coil means 2 along the rail 9a of the guide means 9 and the second gradient coil means 3 is moved with the inner RF coil 10 into the gradient coil means 2 along the rail 9a to such a position that the RF pulse can be transmitted by the second RF coil means 10, the inversion gradient to the heart can be applied by the gradient coil 4a, and the MR data from the heart can be received by the second RF coil means 10.

Next, the switch means 21 is switched to connect the gradient power source 25 to the gradient coil 4a, and the switch means 22 is switched to connect the duplexer 26 to the second RF coil means 10.

Then, the system controller 31 controls the gradient power sources 23,24,25 to drive the coils 6,5,4a respectively, so that the coils 6,5,4a can apply the slice-selecting gradient, the phase-encoding gradient and the readout gradient(with rapid rise time and large amplitude), respectively; controls the transmitter 29 to transmit the RF pulse from the second RF coil means 10; and controls the receiver 30 to receive MR data from the heart through the second RF coil means 10. The application and sampling of these gradients or pulses are performed according to a predetermined pulse sequence of the echo planar imaging.

Next, CPU 32 reconstructs the MR data into imaging data and the display 33 displays the imaging data. Secondly, the standard scan, for example, of the abdomen of the patient 1 is described. In this case, the spin echo imaging, field echo imaging etc. are effective enough to acquire image data of the abdomen.

Figure 4B:
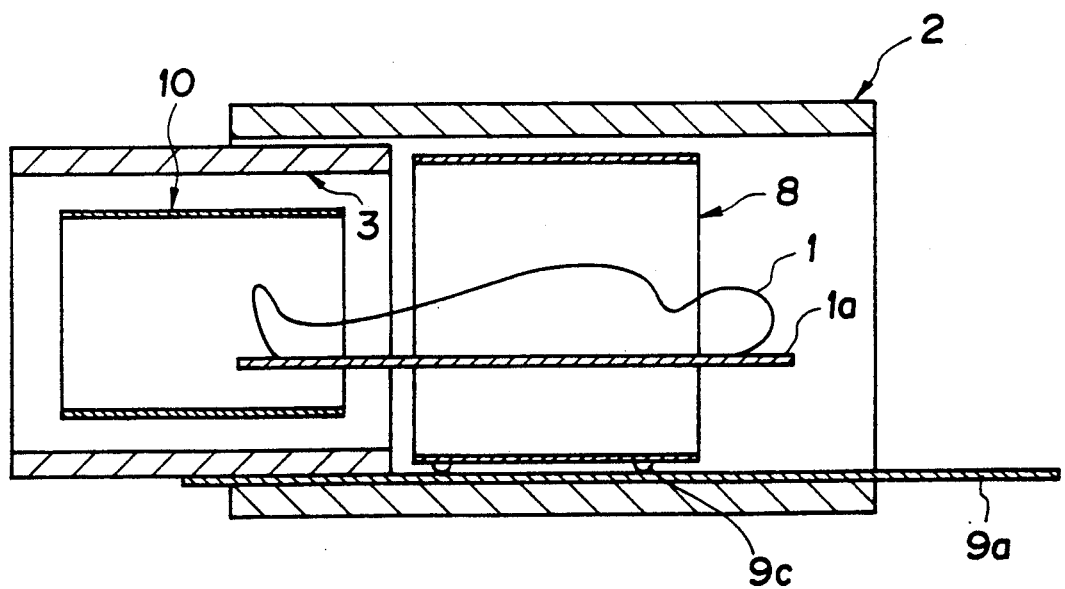

Therefore, as shown in FIG. 4B, the first RF coil means 8 is moved into the first gradient coil means 2 along the rail 9a of the guide means 9 and the second gradient coil means 3 is moved with the second RF coil means 10 out of the first gradient coil means 2 along the rail 9a to such a position that the RF pulse can be transmitted to the abdomen by the first RF coil means 8, the gradient can be applied by the gradient coil 4,5,6 and the MR data from the abdomen can be received by the first RF coil means 8.

Next, the switch means 21 is switched to connect the gradient power source 25 to the gradient coil 4 and the switch means 22 is switched to connect the duplexer 26 to the first RF coil means 8.

Then, the system controller 31 controls the gradient power sources 23,24,25 to drive the corresponding gradient coils 6,5,4 respectively so that the coils 6,5,4 can apply the slice-selecting gradient, the phase-encoding gradient and the readout gradient, respectively, controls the transmitter 29 to transmit an pulse from the first RF coil means 8; and controls the receiver 30 to receive MR data from the abdomen through the first RF coil means 8. The application and sampling of these gradients, or pulses, are performed according to a predetermined pulse sequence of, for example, the spin echo method.

Then, CPU 32 reconstructs the MR data into imaging data and the display 33 displays the imaging data.

In the above embodiment, the second gradient coil means and the first RF coil means can be moved to predetermined positions easily by the guide mean. Also, the connection of the gradient power source to the gradient coil can be switched quickly by the switch means.

Therefore the standard scan with spin echo etc. and the rapid scan with echo planar etc. including blood flow imaging or angiography, need not to be performed by different systems, but rather can both be performed in the same MR imaging system without substantially modifying the gradient power source from that of a presently-existing typical MR imaging system.

Further, in the above embodiment, though the present invention has been described as carried out in a rapid scan, mode is not desired to be limited thereby. For example, the MR imaging system of the invention can be applied in an imaging technique which requires very large gradient amplitude, rapid switching capabilities and high sampling rate, such as imaging technique for blood flow or angiography. In an above embodiment, the second RF coil means is attached to the second gradient coil means, so the preparation of imaging can be facilitated.

Furthermore, the moving means comprises an actuator for actuating the second gradient coil means and the first RF coil means, but these can be moved by hand.

The positioning means comprises the moving means for moving the second gradient coil means and the first RF coil means. However, the positioning means may alternatively locate one of the first RF coil means and the second gradient coil means within the first gradient coil means.

In the first operating mode, the positioning means draws out the second gradient coil means and the second RF coil means from the first gradient coil means and inserts the first RF coil means into the first gradient coil means.

In the second operating mode, the positioning means draws out the first RF coil means from the first gradient coil means and inserts the second gradient coil means and the second RF coil means into the first gradient coil means.

In this modification, similarly, the second gradient coil means or the first RF coil means can be located in a predetermined position quickly and easily so that both a standard scan and a rapid scan can be performed with the same MR imaging system.

Furthermore in the above embodiment, for ease of understanding, we assume that the readout direction is the x-axis, the phase-encoding direction is the y-axis, and the slice-selecting direction is the z-axis and thus the gradient coil 4 and 4a are used for a readout gradient, the gradient coil 5 and 5a are used for a phase-encoding gradient, and the gradient coil 6 and 6a are used for a slice-selecting gradient.

However, each of these directions can be set other axes. For example, the readout direction can be the y-axis, the phase-encoding direction can be the z-axis, and the slice-selecting direction can be the x-axis.

In this case, the gradient power source 23 and 24 are connected to the gradient coil 4 and 6 respectively and the gradient power source 25 is connected to the gradient coil 5 or 5a selectively by a switch means.

Furthermore in above embodiment, in the rapid scan the gradient coil 5,6 are used, but the gradient coil 5a, 6a can be used alternately.

Figure 5A:
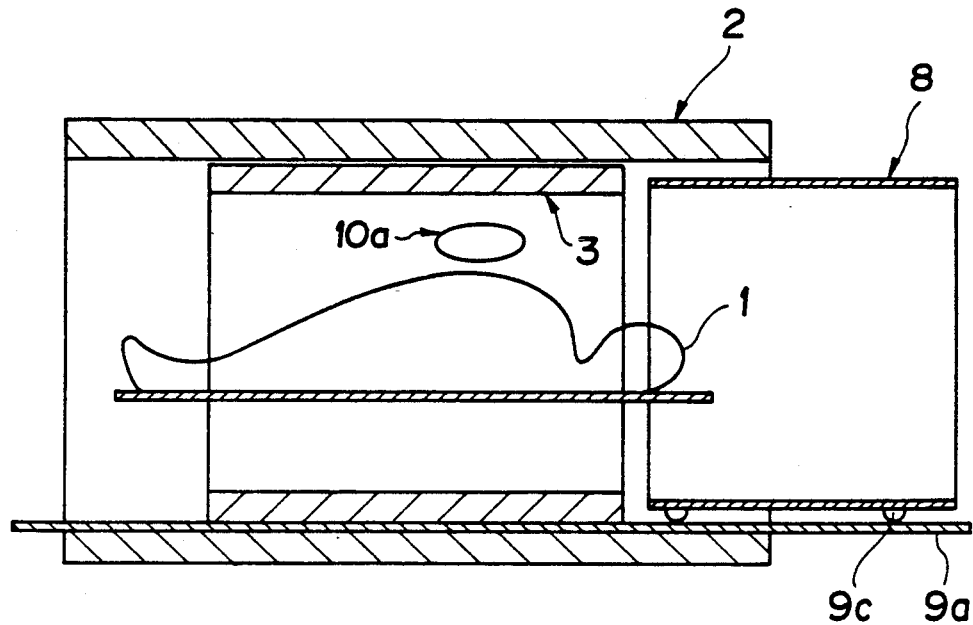
FIG. 5A and 5B are sections showing an operation of a modification of the preferred embodiment.

FIG. 5A shows a modification of the embodiment in case of fat patient. If a patient is fat, the patient cannot be entered the second RF coil means 10 of cylindrical type. In this case, a surface type RF coil 10a can be used as shown in FIG. 5A.

Figure 5B:
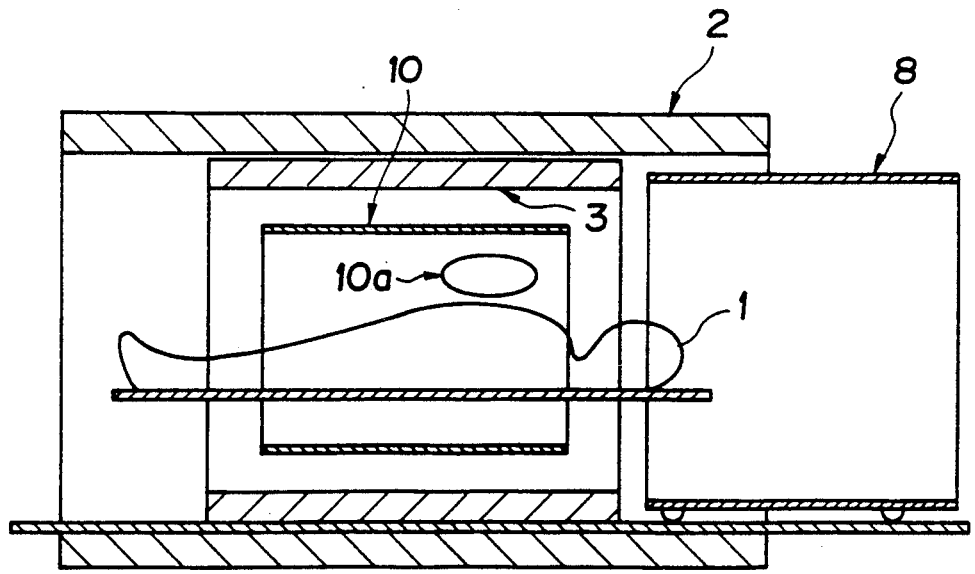

FIG. 5B shows a further modification of the embodiment. As shown in FIG. 5B, even though a patient is not fat, both the second RF coil means 10 and the surface type RF coil 10a can be used. Futhermore in the above embodiment, the second gradient coil means 3 and the first RF coil means 8 are moved independently, but can be moved dependently.

Figure 6A:
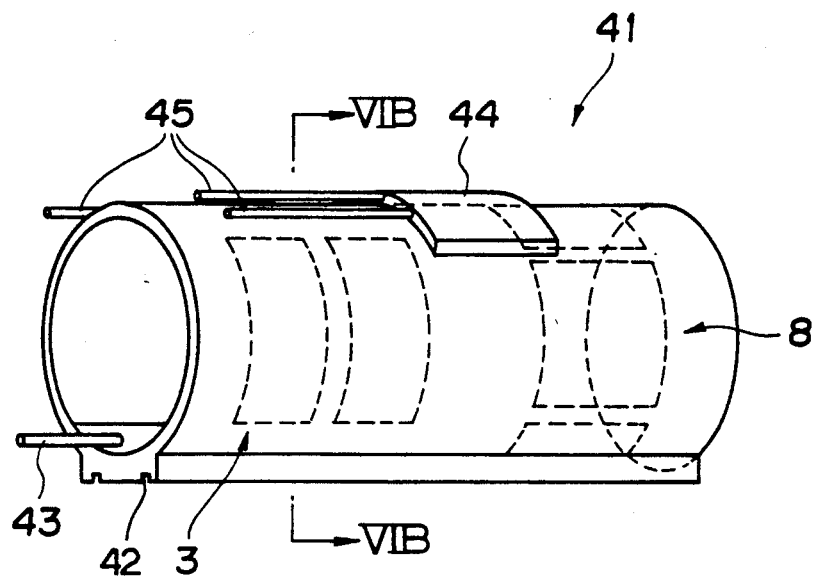
FIG. 6A is an isometric view showing another modification of the embodiment.
Figure 6B:
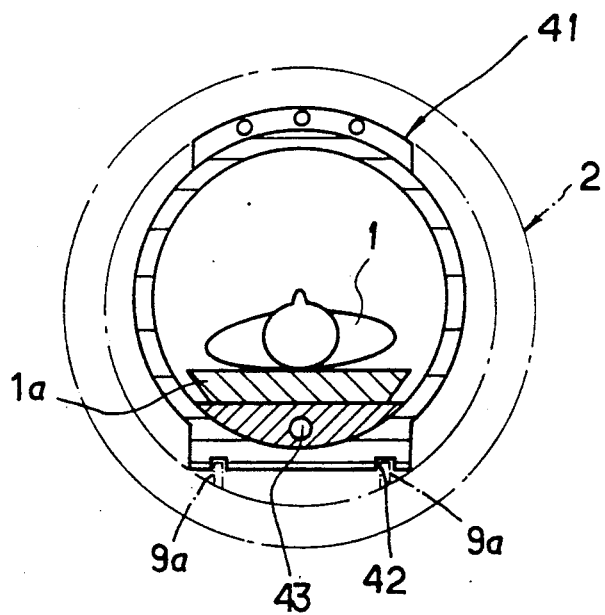
FIG. 6B is a sectional view taken along a VIB—VIB line of the FIG. 6A.

FIG. 6A shows a modification of the embodiment in which the first RF coil means 8 and the second gradient coil means 3 are integrated into one unit, which is to be located inside the first gradient coil means 2, being referred to herein as an inner unit 41. FIG. 6B is a section taken along the VIB—VIB line of FIG. 6A.

The inner unit 41 is provided with a slot 42 in a base plate attached to the outer surface of the inner unit 41, into which the rail 9a in the gradient coil means 2 are fitted. The inner unit 41 further comprises a cable 43 for the second gradient coil means 3 inside the inner unit 41 and an adjuster 44 for the first RF coil means 8 with a cable 45 for the adjuster 44.

In operation, the inner unit 41 is moved along the rail 9a so that in the rapid scan the second gradient coil means 3 can be located in a predetermined position and in the standard scan the first RF coil means 8 can be located in a predetermined position.

Therefore, the second gradient coil means 3 and the first RF coil means 8 need not move independently but can be moved together.

Figure 7A:
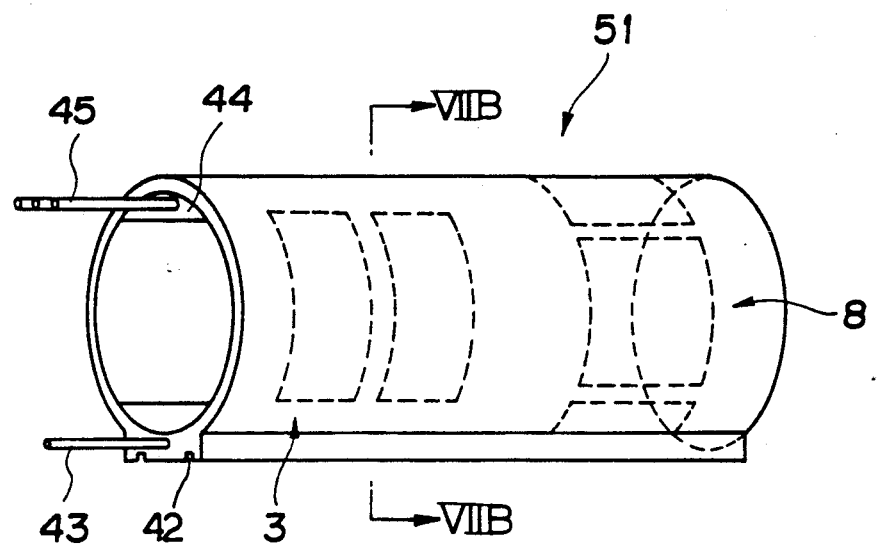
FIG. 7A is an isometric view showing further modification of the embodiment.
Figure 7B:
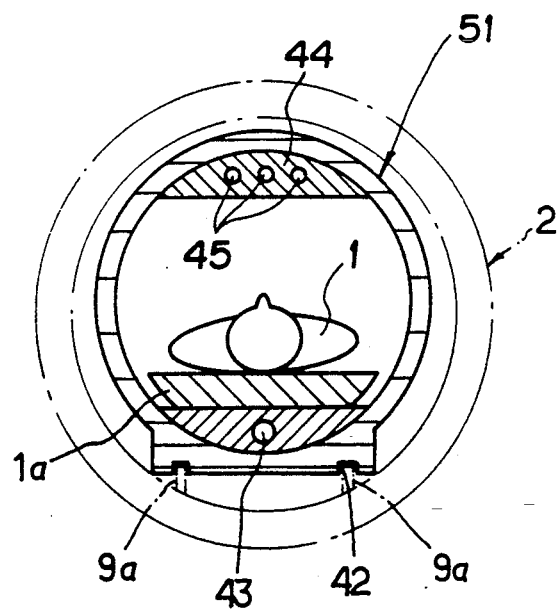
FIG. 7B is a sectional view taken along a VIB—VIB line of the FIG. 7A.

FIG. 7A shows a modified inner unit 51 of the inner unit 41 and FIG. 7B is a section taken along VIIB—VIIB line of FIG. 7A.

The inner unit 51 is provided with an adjuster 44 similar to the inner unit 41, but in this modification, the adjuster 44 is provided in an inner surface of the inner unit 51. A radial distance between the first gradient coil means 2 and the inner unit 51 can thus be minimized so that a lateral bore of the inner unit 51 can be extended. Therefore, a larger patient can be entered into the inner unit 51.

With the above modifications, the slot 42 is provided in a base plate attached to the outer surface of the inner units 41 and 51, not shown, but can also be provided in the outer surface of the inner unit 41 and 51 directly so as to extend the lateral bore of the inner unit 41 and 51.

Figure 8:
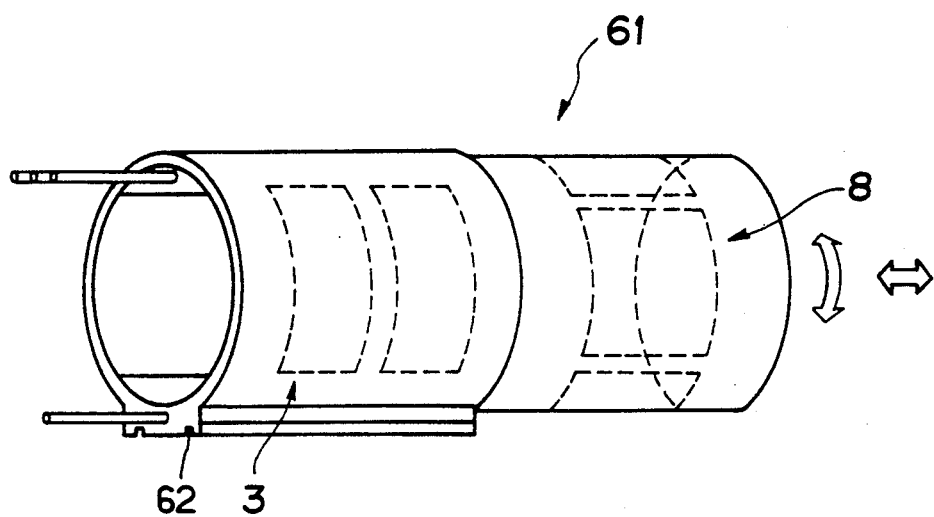
FIG. 8 is an isometric view showing still further modification of the embodiment.

FIG. 8 shows a further modified inner unit 61 of the inner unit 41, wherein the first RF coil means 8 is connected to the second gradient coil means 3 movably along directions shown in FIG. 8.

The second gradient coil means 3 is generally molded in an epoxy resin etc. to fix the gradient coil of the second gradient coil means 3, so the second gradient coil means 3 is heavy and hard. On the other hand, the first RF coil means 8 can be made by lighter and more flexible material. Therefore, the first RF coil means 8 should be moved in a longitudinal direction and a rotational direction relative to the second gradient coil means 3, and a slot 62 should be provided in the second gradient coil means 3.

According to this modification, a position of the first RF coil means 8 relative to the first gradient coil means 2 can be adjusted. Therefore, a shift of the position caused by a long-term use can be adjusted.

Figure 1B:
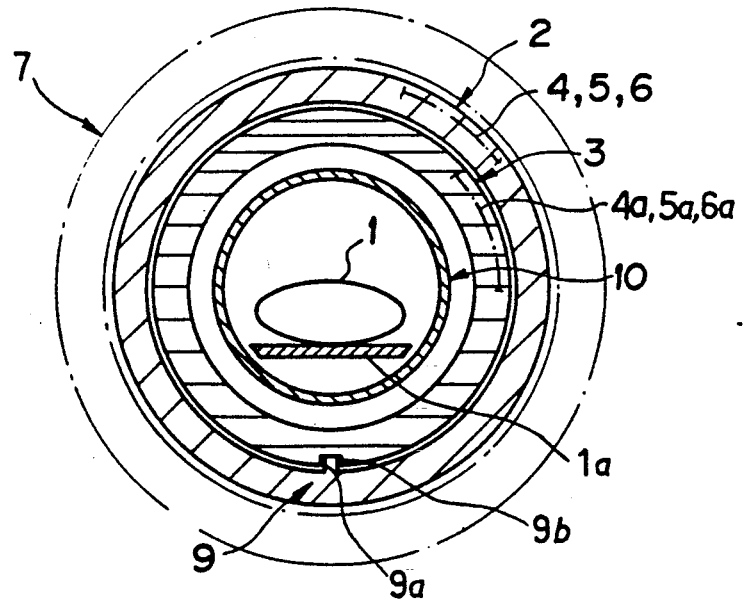
FIG. 1B is a section taken along a IB—IB line of FIG. 1A.
Figure 9A:
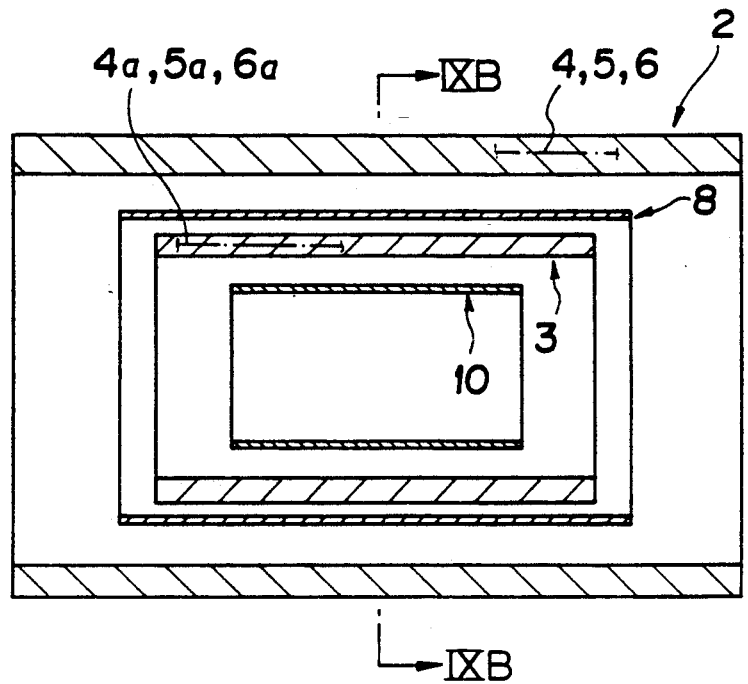
FIG. 9A is an isometric view showing a variation of the embodiment.
Figure 9B:
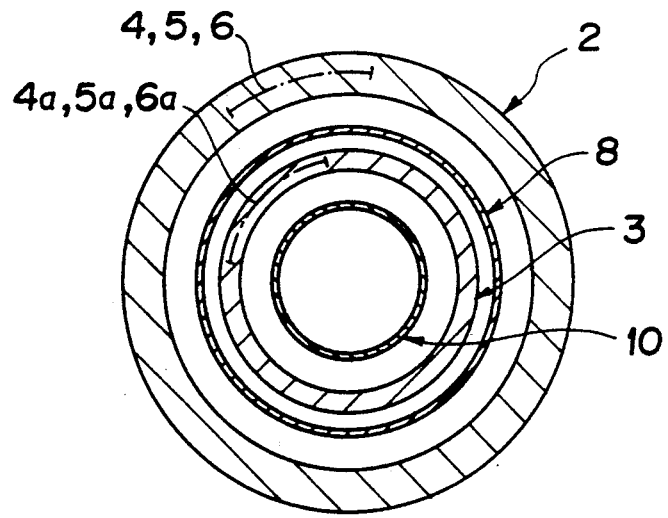
FIG. 9B is a sectional view taken along a IXB—IXB line of the FIG. 9A.

FIG. 9A shows a variation of the embodiment shown in FIG. 1 and FIG. 9B is a section taken IXB—IXBB line of FIG. 9A.

As shown in FIGS. 9A and 9B, the positioning means selectively locates the second gradient coil means 3 and the second RF coil means 10 within the first RF coil mean 8.

The variation, not shown in FIGS. 9A and 9B, further comprises a switch means 21a for switching a connection of the gradient power source 23 to the gradient coil 6 or 6a, a connection of the gradient power source 24 to the gradient coil 5 or 5a and a connection of the gradient power source 25 to the gradient coil 4 or 4a and the switch means 22.

Figure 10A:
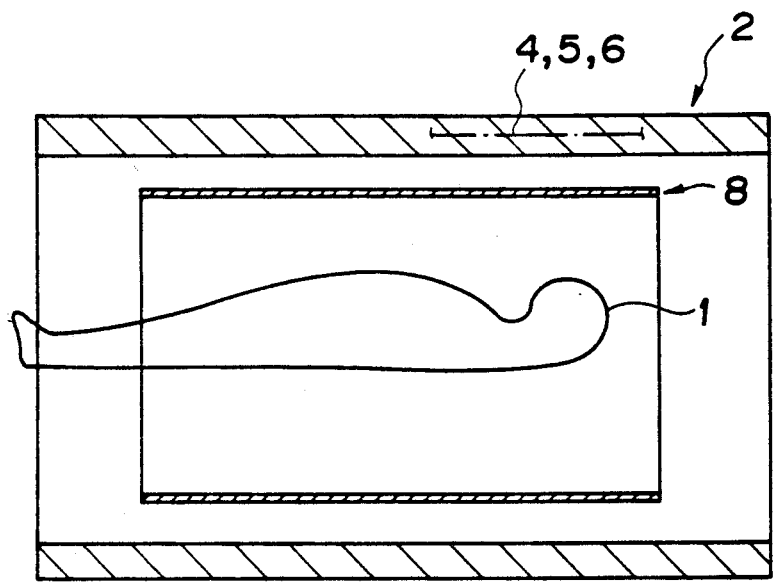
FIG. 10A and 10B are sections showing operation of a variation.

In the first operating mode, as shown in FIG. 10A, the positioning means draws out the second gradient coil means 3 and the second RF coil means 10 from the first RF coil means 2. Further, the switch means 21a is operated so that the gradient power source 23,24 and 25 are connected to the gradient coil 6,5 and 4 respectively and the switch means 22 is operated so that the duplexer 26 is connected to the first RF coil means 8.

Figure 10B:
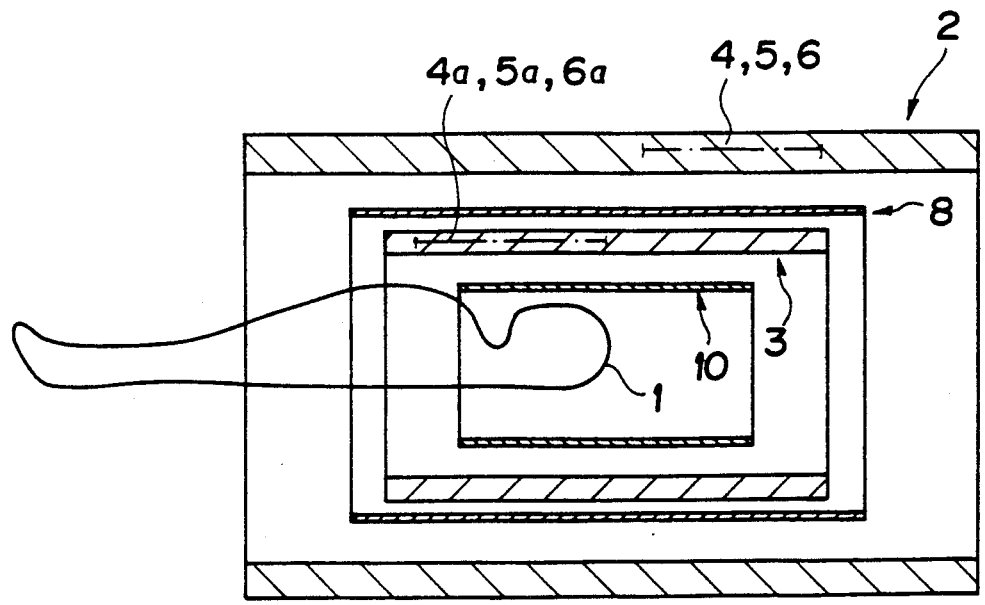

In the second operating mode, as shown in FIG. 10B, the positioning means inserts the second gradient coil means 3 and the second RF coil means 10 into the first RF coil means 8.

Further, the switch means 21a is operated so that the gradient power sources 23,24 and 25 are connected to the gradient coil 6a, 5a and 4a, respectively, and the switch means 22 is operated so that the duplexer 26 is connected to the second RF coil means 10.

In the above embodiments, modifications and variations, the data of a head is acquired with EPI, according to this invention, data of a moving knee elbow of a human body can be acquired substantially real time with moving articulation.

While presently preferred embodiments of the invention have been described in detail herein, many other variations and modifications will now become apparent to those skilled in the art.

What is claimed is:

1. An MR imaging system for forming image of sample using a nuclear magnetic resonance, comprising:
   a magnet for applying a static magnetic field to the sample;
   a first gradient coil means for providing magnetic gradients in a readout direction, a phase-encoding direction and a slice-selecting direction which are superimposed on the static magnetic field, said first gradient coil means being provided between the sample and said magnet and comprises three gradient coils for providing the magnetic gradients;
   a first RF coil means for transmitting an RF pulse to the sample and receiving a nuclear resonace from the sample, said first RF coil means being provided between the sample and said first gradient coil means;
   a second gradient coil means for providing at least a magnetic gradient in a readout direction which is superimposed on the static magnetic field, said second gradient coil means being located between the sample and said first gradient coil means and comprises at least one gradient coil for providing the magnetic gradient;
   a second RF coil means for transmitting an RF pulse to the sample and receiving a nuclear resonace from the sample, said second RF coil means being provided between the sample and said second gradient coil means; and
   a selection means for alternatively selecting one of a first operating mode in which at least said first gradient coil means and said first RF coil means are operated and a second operating mode in which at least said second gradient coil means and said second RF coil means are operated.

2. An MR imaging system according to claim 1, wherein in said first operating mode, said three gradient coils provided in said first gradient coil means are operated and in said second operating mode, said gradient coil for said readout direction provided in said second gradient coil means and said gradient coils for said phase-encoding direction and said slice-selecting direction provided in said first gradient coil means are operated.

3. An MR imaging system according to claim 1 wherein second gradient coil means comprises three gradient coils for providing magnetic gradients in a readout direction, a phase-encoding direction and a slice-selecting direction and wherein, in the first operating mode, said three gradient coils provided in said first gradient coil means are operated and in the second operating mode, said three gradient coil provided in said second gradient coil means are operated.

4. An MR imaging system according to claim 1 wherein said selection means comprises a positioning means for locating said first RF coil means in a predetermined position in the first operating mode and locating said second gradient coil means and said second RF coil means in predetermined positions in the second operating mode.

5. An MR imaging system according to claim 4 wherein said positioning means comprises a moving means for moving said first RF coil means and said second gradient coil means.

6. An MR imaging system according to claim 5 wherein said moving means comprises a guide means for guiding said first RF coil means and said second gradient coil means.

7. An MR imaging system according to claim 6 wherein said guide means comprises a first mating means provided in an inner surface of said first gradient coil means, a second mating means provided in an outer surface of said second gradient coil means for receiving said first mating means of said first gradient coil means, and a third mating means provided in an outer surface of said first RF coil means for receiving said second mating means of said second gradient coil means.

8. An MR imaging system according to claim 5 wherein said moving means comprises an actuator.

9. An MR imaging system according to claim 8 wherein said actuator is an electric motor.

10. An MR imaging system according to claim 5 wherein said first RF coil means and said second gradient coil means are operatively connected and said moving means moves said second gradient coil means and said first RF coil means together.

11. An MR imaging system according to claim 10 wherein said first RF coil means and said second gradient coil means are integrated into one unit.

12. An MR imaging system according to claim 10 wherein said first RF coil means is connected to said second gradient coil means movably.

13. An MR imaging system according to claim 4 wherein said positioning means locates one of said first RF coil means and said second gradient coil means alternatively within said the first gradient coil means.

14. An MR imaging system according to claim 4 wherein said positioning means selectively locates said second gradient coil means and said second RF coil means within said first RF coil means.

15. An MR imaging system according to claim 1, 5, 13 or 14, wherein said second RF coil means is attached to said second gradient coil means.

16. An MR imaging system according to claim 1 wherein said second gradient coil means comprises an adjuster provided within said second gradient coil means for adjusting said magnetic gradient in said readout direction provided by said second gradient coil means.

17. An MR imaging system according to claim 1, further comprises:
- a gradient power source for operating said first gradient coil means and said second gradient coil means; and
- a duplexer for switching a transmitting of said RF pulse and a receiving of said nuclear magnetic resonace,
- wherein said selection means comprises a first switch means for switching a connection of said gradient power source to said first gradient coil means and said second gradient coil means and a second switch means for switching a connection of said duplexer to said first RF coil means and said second RF coil means.

18. An MR imaging system according to claim 17 wherein said gradient power source comprises three elements for a readout direction, a phase-encoding direction and a slice-selecting direction, and wherein said firs switch means comprises a switch for switching said connection so that, in the first operating mode, said elements are connected to said corresponding gradient coils provided in said first gradient coil means and in the second operating mode, said element for readout direction is connected to said corresponding gradient coil provided in said second gradient coil means and said elements for a phase-encoding direction and a slice-selecting direction are connected to said corresponding gradient coils provided in said first gradient coil means.

19. An MR imaging system according to claim 17 wherein said gradient power source comprises three elements for a readout direction, a phase-encoding direction and a slice-selecting direction, and wherein said first switch means comprises three switch for switching said connection so that, in the first operating mode, said elements are connected to said corresponding gradient coils provided in said first gradient coil means and in the second operating mode, said elements are connected to said corresponding gradient coils provided in said second gradient coil means.

* * * * *